(12) United States Patent
Khoueir et al.

(10) Patent No.: US 9,231,086 B2
(45) Date of Patent: Jan. 5, 2016

(54) THREE DIMENSIONAL FLOATING GATE NAND MEMORY

(71) Applicant: SEAGATE TECHNOLOGY LLC, Cupertino, CA (US)

(72) Inventors: Antoine Khoueir, Apple Valley, MN (US); YoungPil Kim, Eden Prairie, MN (US); Rodney Virgil Bowman, Bloomington, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/264,605

(22) Filed: Apr. 29, 2014

(65) Prior Publication Data

US 2015/0011062 A1    Jan. 8, 2015

Related U.S. Application Data

(62) Division of application No. 13/434,994, filed on Mar. 30, 2012, now abandoned.

(51) Int. Cl.
| | |
|---|---|
| H01L 27/115 | (2006.01) |
| H01L 29/66 | (2006.01) |
| H01L 29/788 | (2006.01) |
| H01L 29/40 | (2006.01) |
| H01L 29/423 | (2006.01) |

(52) U.S. Cl.
CPC .... *H01L 29/66825* (2013.01); *H01L 27/11519* (2013.01); *H01L 27/11551* (2013.01); *H01L 27/11556* (2013.01); *H01L 29/401* (2013.01); *H01L 29/42324* (2013.01); *H01L 29/7889* (2013.01)

(58) Field of Classification Search
CPC ............... H01L 29/66825; H01L 27/11517; H01L 27/11521; H01L 27/11524
USPC .................................. 257/E21.209, E21.614
See application file for complete search history.

(56) References Cited

U.S. PATENT DOCUMENTS

| | | | | |
|---|---|---|---|---|
| 7,135,726 | B2 * | 11/2006 | Endoh et al. .................. | 257/296 |
| 8,053,302 | B2 * | 11/2011 | Seol et al. ..................... | 438/201 |
| 8,072,024 | B2 * | 12/2011 | Ishikawa et al. .............. | 257/324 |
| 8,187,936 | B2 * | 5/2012 | Alsmeier et al. .............. | 438/264 |

(Continued)

OTHER PUBLICATIONS

Tanaka et al., "Bit Cost Scalable Technology with Punch and Plug Process for Ultra High Density Flash Memory," *VLASI Tech Dig.*, pp. 14-15, 2007.

(Continued)

*Primary Examiner* — Fernando L Toledo
*Assistant Examiner* — Christine L Hagan
(74) *Attorney, Agent, or Firm* — Mueting, Raasch & Gebhardt, P.A.

(57) ABSTRACT

Memory arrays that include a first memory cell having a channel; a first insulator; a floating gate; a second insulator; and a control gate, wherein the first insulator is positioned between the channel and the floating gate, the second insulator is positioned between the floating gate and the control gate; and a second memory cell having a channel; a first insulator; a floating gate; a second insulator; and a control gate, wherein the first insulator is positioned between the channel and the floating gate, the second insulator is positioned between the floating gate and the control gate, wherein the first memory cell and the second memory cell are positioned parallel to each other.

20 Claims, 7 Drawing Sheets

(56) References Cited

U.S. PATENT DOCUMENTS

| | | | |
|---|---|---|---|
| 8,236,650 B2 * | 8/2012 | Son et al. | 438/268 |
| 8,319,275 B2 * | 11/2012 | Shim et al. | 257/324 |
| 8,330,208 B2 * | 12/2012 | Alsmeier et al. | 257/321 |
| 8,349,681 B2 * | 1/2013 | Alsmeier et al. | 438/216 |
| 8,445,954 B2 * | 5/2013 | Jang et al. | 257/329 |
| 9,105,736 B2 * | 8/2015 | Son et al. | 257/239 |
| 2002/0036308 A1 * | 3/2002 | Endoh et al. | 257/298 |
| 2006/0240622 A1 * | 10/2006 | Lee et al. | 438/257 |
| 2007/0158736 A1 * | 7/2007 | Arai et al. | 257/315 |
| 2007/0252201 A1 * | 11/2007 | Kito et al. | 257/331 |
| 2008/0173928 A1 * | 7/2008 | Arai et al. | 257/316 |
| 2008/0175032 A1 * | 7/2008 | Tanaka et al. | 365/51 |
| 2009/0242967 A1 * | 10/2009 | Katsumata et al. | 257/324 |
| 2009/0283819 A1 * | 11/2009 | Ishikawa et al. | 257/324 |
| 2009/0310425 A1 * | 12/2009 | Sim et al. | 365/185.29 |
| 2010/0044778 A1 * | 2/2010 | Seol et al. | 257/326 |
| 2010/0155810 A1 * | 6/2010 | Kim et al. | 257/316 |
| 2010/0155818 A1 * | 6/2010 | Cho et al. | 257/324 |
| 2010/0302849 A1 | 12/2010 | Jung | |
| 2011/0298013 A1 * | 12/2011 | Hwang et al. | 257/208 |
| 2012/0001249 A1 * | 1/2012 | Alsmeier et al. | 257/319 |
| 2012/0001252 A1 * | 1/2012 | Alsmeier et al. | 257/321 |
| 2012/0199898 A1 * | 8/2012 | Alsmeier et al. | 257/326 |
| 2015/0179662 A1 * | 6/2015 | Makala et al. | 438/268 |

OTHER PUBLICATIONS

Jang et al.,"Vertical Cell Array Using TCAT (Terabit Cell Array Transistor) Technology for Ultra High Density NAND Flash Memory,", *VLSI Tech Dig.*, pp. 192-193, 2009.

Kimura, Masahide, "3D Cells Make Terabit NAND Flash Possible," *Tech-On*, Sep. 17, 2009.

* cited by examiner

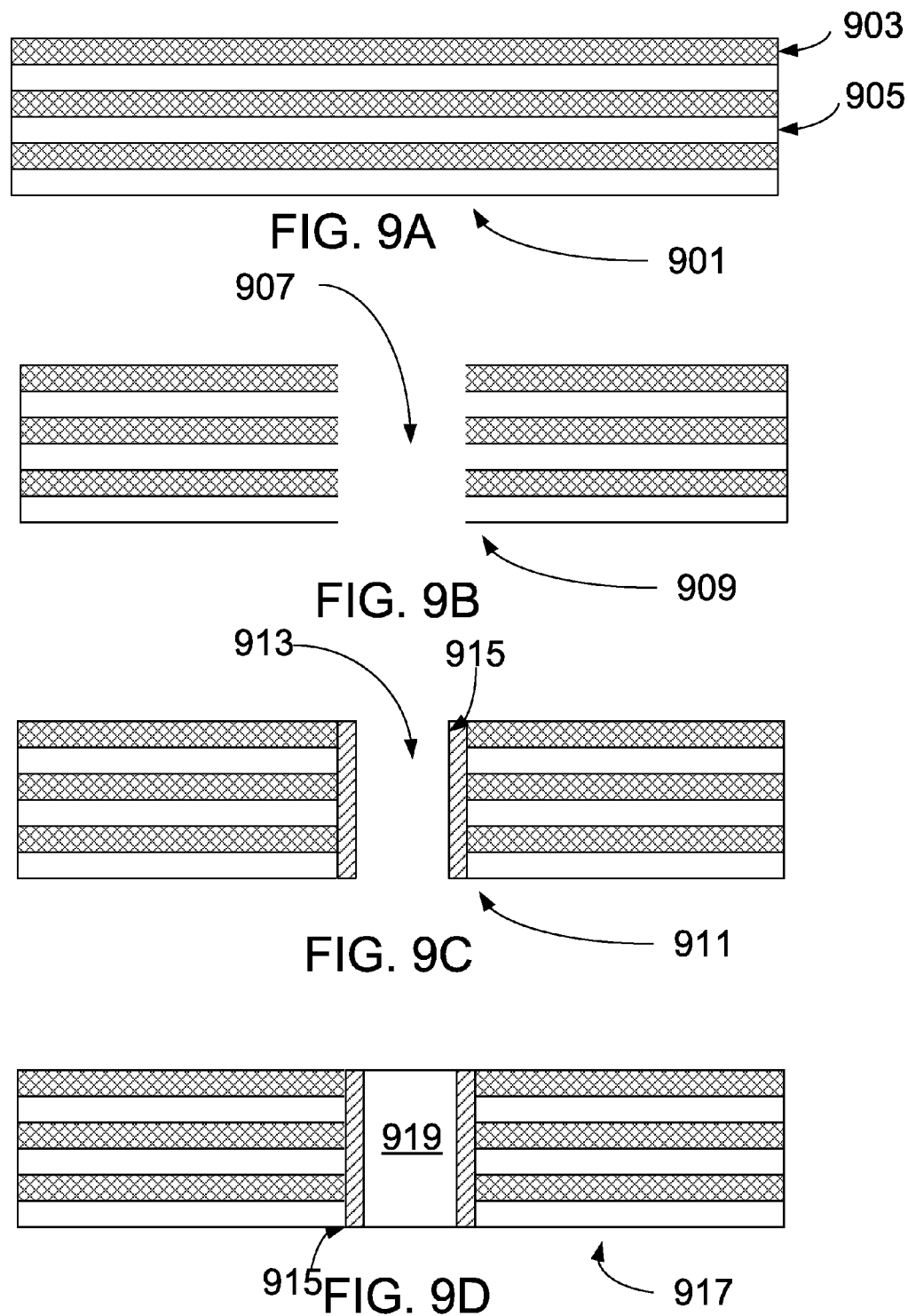

THREE DIMENSIONAL FLOATING GATE NAND MEMORY

This is a divisional application of U.S. patent application Ser. No. 13/434,994, filed Mar. 30, 2012.

BACKGROUND

NAND flash memory is thought to offer the promise of lower costs and larger capacity than other flash memory types. In order to appreciate those advantages, it is thought that three dimensional NAND memory structures will have to be utilized.

SUMMARY

Disclosed herein are memory arrays that include a first memory cell having a channel; a first insulator; a floating gate; a second insulator; and a control gate, wherein the first insulator is positioned between the channel and the floating gate, the second insulator is positioned between the floating gate and the control gate; and a second memory cell having a channel; a first insulator; a floating gate; a second insulator; and a control gate, wherein the first insulator is positioned between the channel and the floating gate, the second insulator is positioned between the floating gate and the control gate, wherein the first memory cell and the second memory cell are positioned parallel to each other.

Also disclosed are memory arrays that can include at least two vertical stacks of memory cells, each vertical stack including at least two memory cells, the at least two memory cells positioned along a first axis, and each memory cell including a channel; a first insulator; a floating gate; a second insulator; and a control gate wherein the first insulator is positioned between the control gate and the floating gate, the second insulator is positioned between the floating gate and the channel, and the control gate, the first insulator, the floating gate, the second insulator and the channel are positioned along a second axis, wherein the first axis and the second axis are perpendicular to each other; and at least one vertical isolation structure positioned between the first and the second memory cell; and at least one horizontal isolation structure, wherein the at least one horizontal isolation structure isolates a first vertical stack of memory cells from a second vertical stack of memory cells.

Further disclosed are methods of making a memory array that can include steps of depositing a bilayer stack of alternating insulating material and floating gate material; etching a first void in the stack; depositing a first insulating material on at least the walls of the first void forming a second void; depositing channel material in the second void; etching a third void in the stack, the third void being substantially circular and surrounding the channel material; selectively etching portions of the polysilicon layers adjacent the third void forming fourth voids, wherein the fourth voids are generally orthogonal to each other; depositing a second insulating material on the surfaces of the fourth voids; depositing control gate material on the second insulating material forming a sixth void; and depositing isolating material in the sixth void.

BRIEF DESCRIPTION OF THE DRAWINGS

FIGS. 9A-9H and 9J are cross sectional views of an article at various stages in an exemplary method of making.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

"Include," "including," or like terms means encompassing but not limited to, that is, including and not exclusive. It should be noted that "top" and "bottom" (or other terms like "upper" and "lower") are utilized strictly for relative descriptions and do not imply any overall orientation of the article in which the described element is located.

Figure 1:
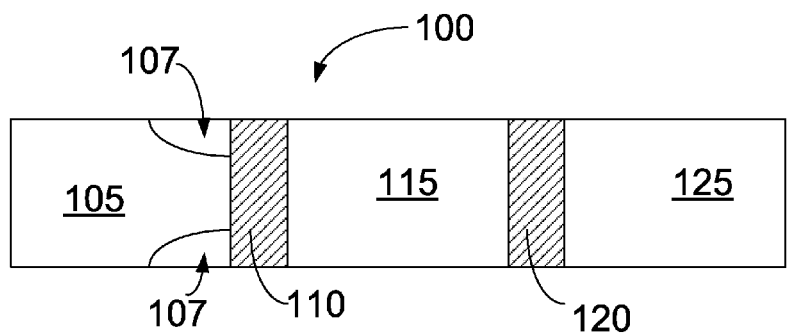
FIG. 1 is a cross sectional view of an exemplary memory cell as disclosed herein.

Disclosed herein are memory arrays that include at least two memory cells. In some embodiments, memory arrays may include a plurality of memory cells. Each memory cell in a memory array can include a channel, a first insulator, a floating gate, a second insulator, and a control gate. An exemplary memory cell is depicted in FIG. 1. The memory cell 100 in FIG. 1 includes a channel 105, a first insulator 110, a floating gate 115, a second insulator 120, and a control gate 125. Generally, the first insulator 110 is positioned between the channel 105 and the floating gate 115 and functions to electrically insulate the channel 105 from the floating gate 115. The second insulator 120 is positioned between the floating gate 115 and the control gate 125 and functions to electrically insulate the floating gate 115 from the control gate 125.

The channel 105 can be formed from a substrate that includes spaced apart localized doped regions 107. One of the doped regions 107 can be doped positively or negatively, and can be referred to as the source or the drain. Generally, the channel 105 can be made of polysilicon (which can also be referred to as polycrystalline silicon or poly-Si), silicon germanium (SiGe, or $Si_{1-x}Ge_x$), gallium nitride (GaN), indium gallium nitride ($In_xGa_{1-x}N$), or aluminum gallium nitride ($Al_xGa_{1-x}N$) for example.

The first insulator 110 can be formed of a tunneling oxide material. Exemplary tunneling oxide materials include magnesium oxide (amorphous, crystalline, or combinations thereof) alumina ($Al_2O_3$), silicon oxide ($SiO_2$ or $SiO_x$), high-k dielectric materials, or combinations thereof. The second insulator 120 can be formed from a multilayer structure of an oxide/nitride/oxide (referred to herein as "ONO"), or a high-k dielectric material. Exemplary high-k dielectric materials can include $HfO_2$, $Z_rO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O4$, $V_2O_3$, $La_2O_3$, $Pr_2O_3$, $Sb_2O_3$, $Sb_3O_5$, and $CaO$. In some embodiments, the second insulator 120 can be made of a multilayer structure of an oxide/nitride/oxide.

In some embodiments, the first insulator 110 and the second insulator 120 are not the same thickness. Generally, the first insulator 110 can have a thickness from 20 Å to 300 Å, or from 50 Å to 200 Å, or from 60 Å to 80 Å. Generally, the second insulator 120 can have a thickness from 50 Å to 400 Å, from 100 Å to 300 Å, from 150 Å to 250 Å, or in an embodiment about 200 Å.

The floating gate 115 can be formed of polysilicon, for example. The control gate 125 can be made of polysilicon, or a metal. In some embodiments the floating gate 115 and the control gate 125 are not the same thickness. Generally, the floating gate 115 and the control gate 125 can independently have thicknesses from 10 nm to 100 nm, or from 20 nm to 60 nm.

Generally, each memory cell operates as a modified n-channel metal oxide semiconductor field effect transistor (MOSFET). Application of a suitable gate voltage to the floating gate 115 establishes a conductive channel through the channel 105 between the adjacent doped regions 107, thereby generating a drain-to-source conductivity path. During a programming operation, a write current through the channel 105 results in the passage of charge through the first insulator 110 to the floating gate 115. The presence of accumulated charge on the floating gate 115 serves to alter the requisite threshold voltage ($V_T$) that needs to be applied to the control gate 125 to establish conductivity through the channel. Hence, the memory cell 100 can store different programmed values in relation to different amounts of accumulated (or stored) charge on the floating gate 115. Increased amounts of charge can be successively added to the floating gate 115 during subsequent write operations. A separate erase operation is required to remove the accumulated (or stored) charge from the floating gate 115 and return the floating gate 115 to an uncharged state. An erase operation can be carried out on an entire block of memory cells at the same time.

Figure 2:
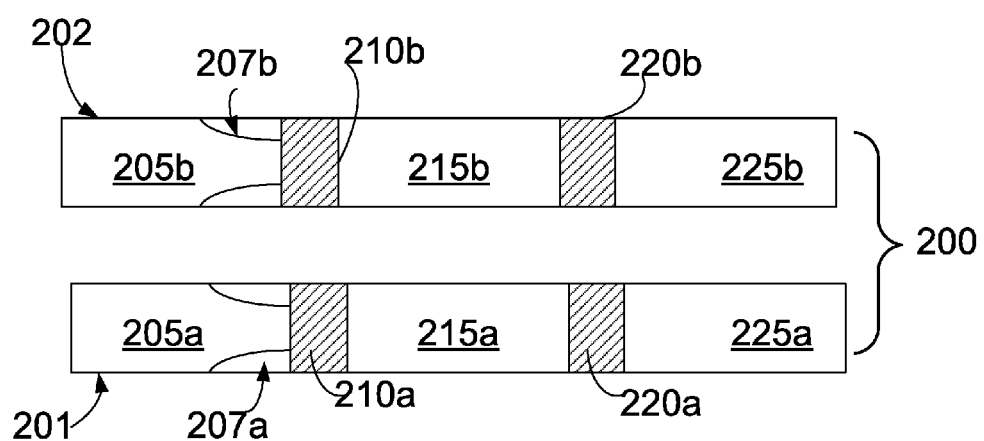
FIG. 2 is a cross sectional view of two exemplary memory cells as disclosed herein.

Some embodiments described herein can include more than one memory cell, such as those described above. Some embodiments can be referred to as memory arrays. A memory array can have at least two memory cells, or a plurality of memory cells. An exemplary memory array can include a first and a second memory cell, such as those described above. The first and second memory cell can be positioned parallel to each other. The first and second memory cell can also be described as being positioned along a first axis, where the components of the individual memory cells are positioned along a second axis, with the first axis being perpendicular to the second axis. An exemplary memory array 200 is depicted in FIG. 2, where the first memory cell 201 is positioned parallel to the second memory cell 202. The first memory cell 201 may be positioned above the second memory cell 202, such as is depicted in FIG. 2, or it may be positioned next to the second memory cell (not depicted herein), so that the first memory cell and the second memory cell are positioned in the same horizontal plane (in such an embodiment, the two memory cells are positioned in the same axis as the individual components of the individual memory cells). In some embodiments, a plurality of memory cells positioned along a first axis may be connected in series.

Figure 3:
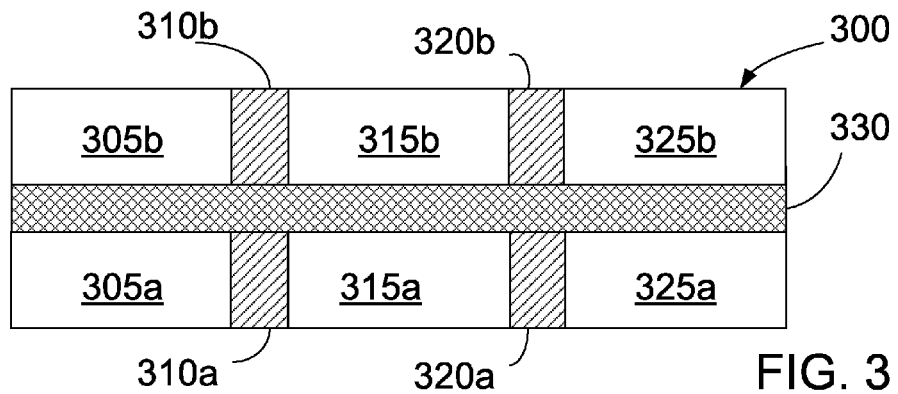
FIG. 3 is a cross sectional view of two exemplary memory cells configured with a vertical isolation structure as disclosed herein.

A memory array can also include a vertical isolation structure. A vertical isolation structure can function to electrically insulate a first memory cell from another vertically adjacent memory cell, for example a vertical isolation structure can function to electrically insulate a first memory cell from a second memory cell that is positioned above (or below) the first memory cell. An exemplary memory array 300 that includes a vertical isolation structure 330 is depicted in FIG. 3. Vertical isolation structures can be made of any electrically insulating material. Exemplary materials can include for example silica ($SiO_2$), alumina ($Al_2O_3$), and silicon nitride ($Si_3N_4$ or $Si_xN_y$). Exemplary memory arrays can also include a plurality of memory cells positioned along a first axis (as described above), with a plurality of vertical isolation structures positioned between the individual memory cells.

Figure 4:
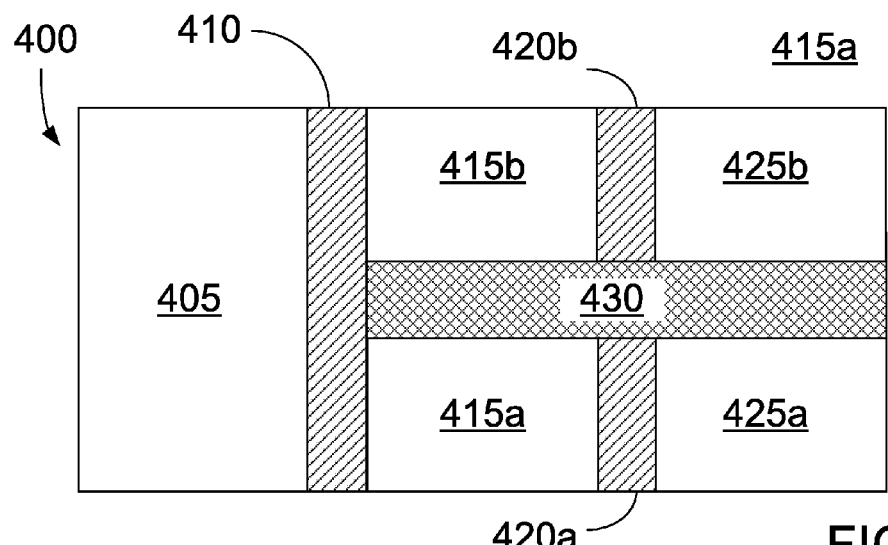
FIG. 4 is a cross sectional view of two exemplary memory cells with shared structures as disclosed herein.

In some embodiments, different memory cells within a memory array can share structures, or can each utilize a single block of material as a component of the memory cell. An exemplary memory array 400 that includes one or more shared structures is depicted in FIG. 4, for the sake of convenience; similar structures are numbered similarly to previous figures. For example, first and second memory cells can utilize a single structure, which can be referred to as a shared structure or in this embodiment a shared channel as the channel. This is depicted in FIG. 4 as the shared channel 405. In such an embodiment, various portions of the shared channel 405 can be positively and negatively doped in order to form doped regions as appropriate for both the first and second memory cells. A shared channel, such as that depicted in FIG. 4 can be made of the same materials as the individual channel structures discussed above. In some embodiments, a shared channel can be utilized by more than two memory cells. The memory array 400 depicted in FIG. 4 also includes a second shared structure, a shared first insulator 410. A shared first insulator can be made of the same materials as the individual first insulators discussed above. In some embodiments, a shared first insulator can be utilized by more than two memory cells. The use of shared structures in memory arrays can increase the efficiency, ease, and/or cost of manufacturing memory arrays such as those described herein.

Figure 5:
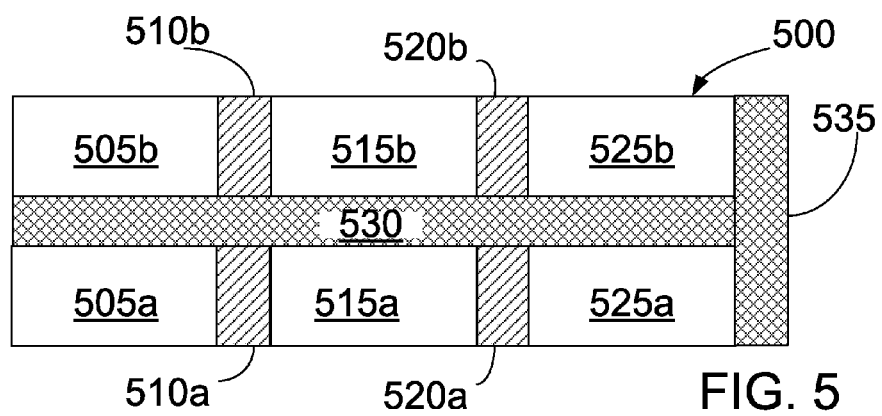
FIG. 5 is a cross sectional view of two exemplary memory cells configured with both a vertical isolation structure and a horizontal isolation structure disclosed herein.

Disclosed memory arrays can also include horizontal isolation structures. Generally, horizontal isolation structures can function to electrically insulate one memory cell from another horizontally adjacent memory cells, for example a horizontal isolation structure can function to electrically insulate a first memory cell from another memory cell that is next to, but not above or below the first memory cell. An exemplary memory array 500 that includes a horizontal isolation structure 535 is depicted in FIG. 5. Horizontal isolation structures can be made of any electrically insulating material. Exemplary materials can include for example silica ($SiO_2$), alumina ($Al_2O_3$), and silicon nitride ($Si_3N_4$ or $Si_xN_y$). Exemplary memory arrays can also include a plurality of memory cells positioned along a second axis (as described above), with a plurality of horizontal isolation structures positioned between the memory cells.

Figure 6:
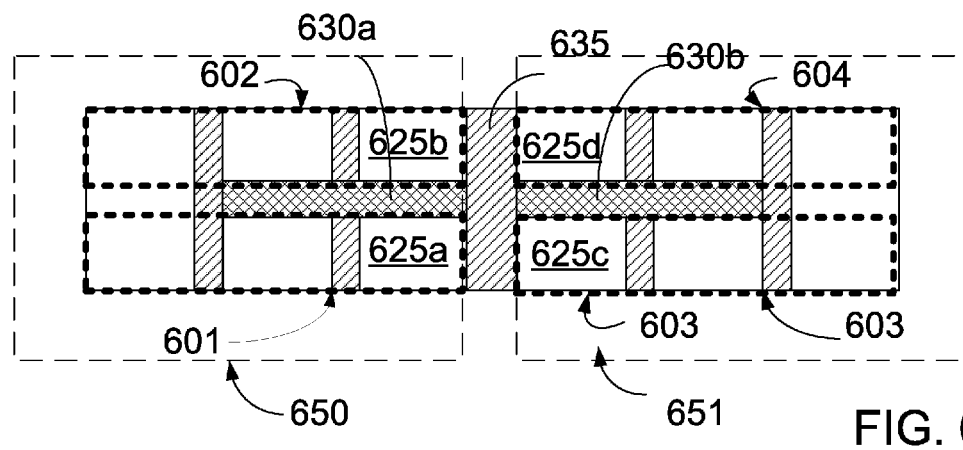
FIG. 6 is a cross sectional view of an exemplary memory array that includes two vertical stacks of memory arrays as disclosed herein.

Another exemplary memory array is depicted in FIG. 6. The exemplary memory array 600 includes a first memory cell 601, a second memory cell 602, a third memory cell 603, and a fourth memory cell 604. The first and second memory cells 601 and 602 are positioned as was described with respect to FIG. 3. The third memory cell 603 can be positioned adjacent the first memory cell 601 along the second axis (i.e., horizontal) and the fourth memory cell 604 can be positioned adjacent the second memory cell 602 along the second axis. It should be noted that the designation of first, second, third, and fourth is for convenience only and should not be considered to limit the scope of this disclosure. The third 603 and fourth 604 memory cells are positioned adjacent each other with one being above the other (in the illustrated embodiment, with the fourth memory cell 604 being above the third memory cell 603). As seen in FIG. 6, the control gates 625c and 625d of the third 603 and fourth 604 memory cells are positioned adjacent the horizontal isolation structure 635. Stated another way, the orientation of the third memory cell 603 is opposite that of the first memory cell 601 and the orientation of the fourth memory cell 604 is opposite that of the second memory cell 602.

In the memory array 600, the horizontal isolation structure 635 isolates the first 601 and third 603 memory cells from each other and the second 602 and fourth 604 memory cells from each other. The first vertical isolation structure 630a isolates the first memory cell 601 from the second memory cell 602; and the second vertical isolation structure 630b isolates the third memory cell 603 from the fourth memory cell 604. It should be noted that even though the horizontal isolation structure 635, the first vertical isolation structure 630a, and the second vertical isolation structure 630b are depicted as separate structures, they can be made of the same materials and/or be a single structure. However, the three structures can also be separate structures that are made of the same or different materials.

The first and second memory cells 601 and 602 can be referred to as a vertical stack 650. Although not depicted herein, a vertical stack can have more than two memory cells. A vertical stack 650 can also include one or more vertical isolation structures, for example vertical isolation structure 630a. The memory array 600 also includes a second vertical stack 651. The second vertical stack 651 includes the third and fourth memory cells 603 and 604, and can also include the vertical isolation structure 630b. A memory array that includes at least two vertical stacks, such as first and second vertical stack 650 and 651 can also include a horizontal isolation structure, such as horizontal isolation structure 635. In such an embodiment, the horizontal isolation structure 635 can be described as isolating, for example electrically isolation or insulating, the first vertical stack from the second vertical stack.

In a memory array that includes at least two vertical stacks, the at least two memory cells within a first vertical stack can be connected in series and the at least two memory cells within the second vertical stack can be connected in series. The memory cells within a first vertical stack 650 can have a configuration that is opposite that of the memory cells within a second vertical stack 651. As seen in FIG. 6, both the control gates 625c and 625d of the third 603 and fourth 604 memory cells (which are part of the second vertical stack 651) and the control gates 625a and 625b of the first 601 and second 602 memory cells (which are part of the first vertical stack 650) are positioned adjacent the horizontal isolation structure 635. Stated another way, the orientation of the third memory cell 603 is opposite that of the first memory cell 601 and the orientation of the fourth memory cell 604 is opposite that of the second memory cell 602.

As was discussed with respect to FIG. 4, portions of the memory cells can be shared in a single vertical stack. For example, the memory cells within the first vertical stack could utilize a shared channel, a shared first insulator, or both. Similarly, the memory cells within the second stack could utilize a shared channel, a shared first insulator, or both. First and second (and optionally further) vertical stacks can be formed from a single stack of bilayer films Further memory cells can be added to the region above and/or below the memory cells depicted in FIG. 6. In addition, the memory array 600 (or a memory array that includes additional memory cells above and/or below those depicted in FIG. 6) can be duplicated horizontally adjacent to the memory array depicted in FIG. 6. Such a memory array could be described as having x number of memory cells in a first axis (for example the vertical axis) and y number of memory cells in a second axis (for example the horizontal axis). The total number of memory cells in such an array would be x×y.

Figure 7:
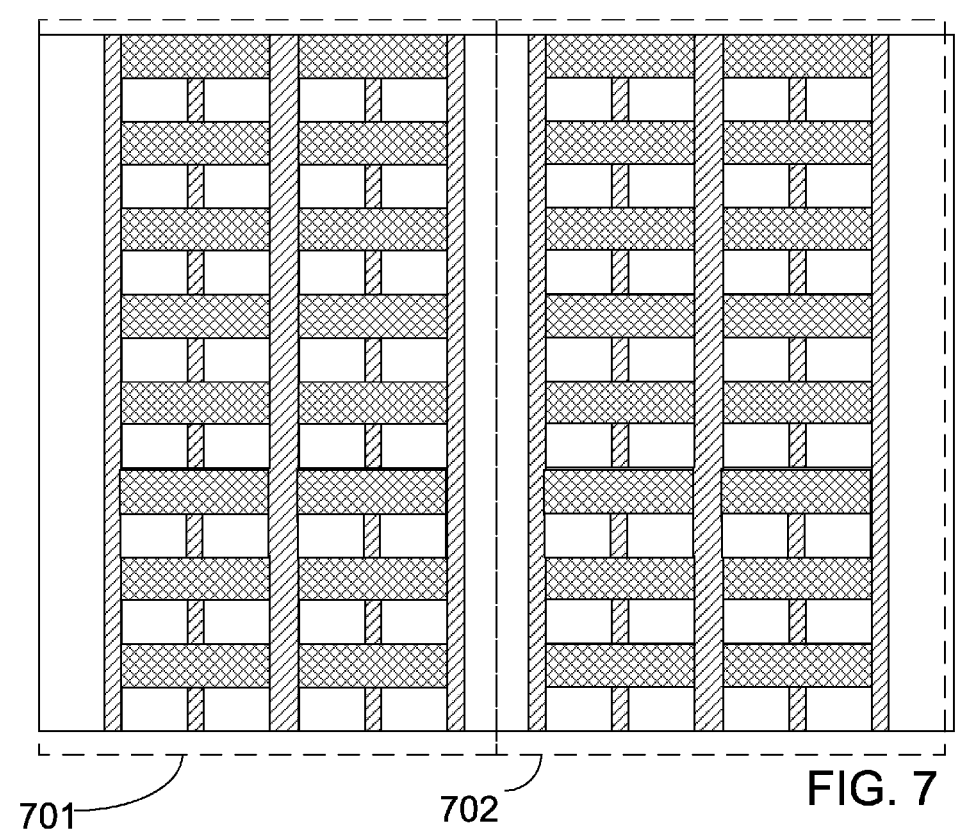
FIG. 7 is a cross sectional view of an exemplary memory array that includes two rows of memory arrays as disclosed herein.

FIG. 7 depicts another exemplary memory array. This exemplary memory array 700 includes a first row 701 and a second row 702. A row, as seen in FIG. 7 can include at least a horizontal isolation structure 735, a first vertical stack 750, and a second vertical stack 751. Both the first vertical stack 750 and the second vertical stack 751 utilize a shared channel and a shared first insulator as can be seen in FIG. 7.

Figure 8:
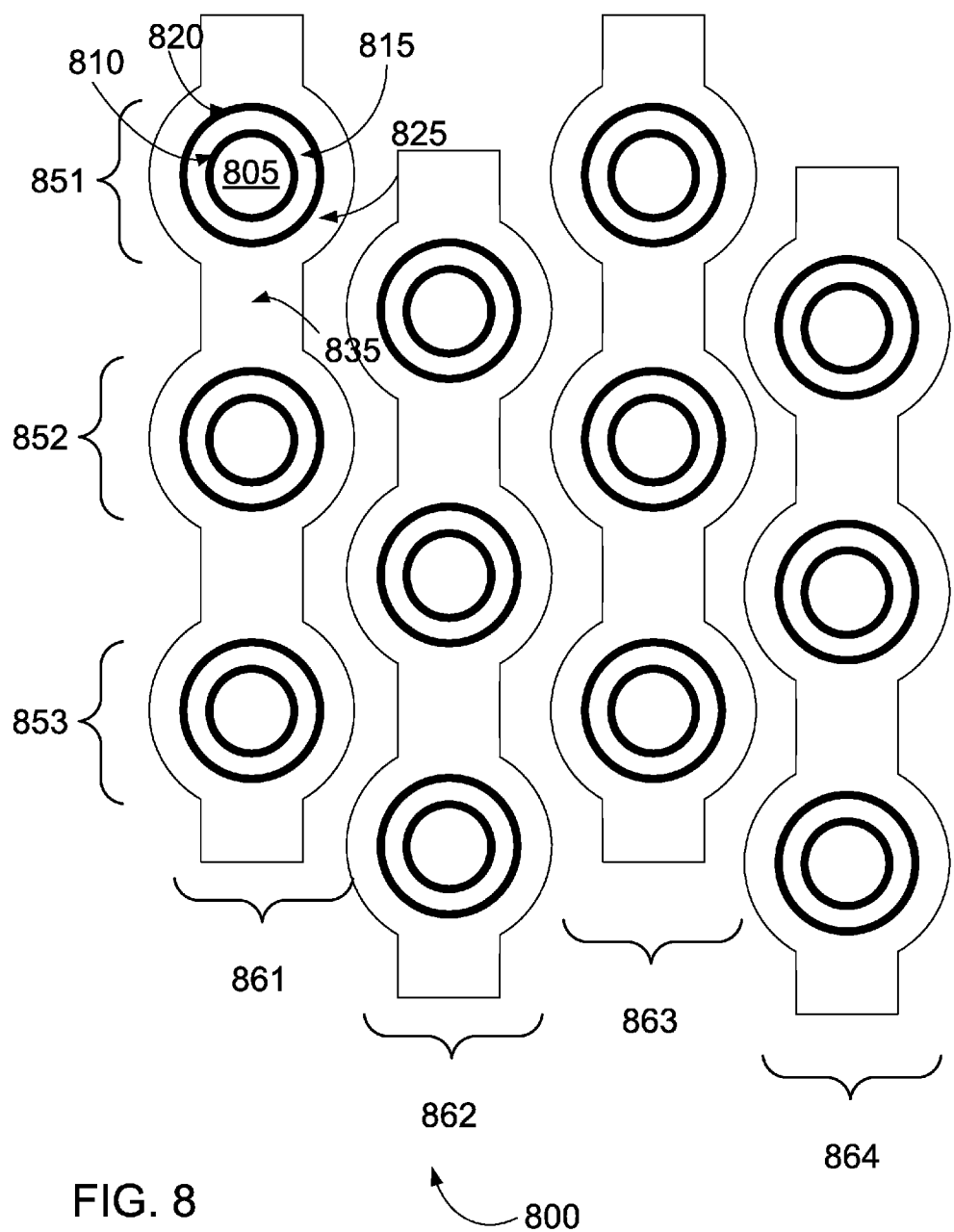
FIG. 8 is a top down view of an exemplary memory array that includes four off set rows of memory arrays as disclosed herein.

FIG. 8 depicts a top down view of an exemplary embodiment of a memory array. The memory array 800 includes a first row 861, a second row 862, a third row 863, and a fourth row 864. Each row includes (in the depicted embodiment) a first vertical stack (exemplified by first vertical stack 851 of the first row 861), a second vertical stack (exemplified by the second vertical stack 852 of the first row 861), a third vertical stack (exemplified by the third vertical stack 853 of the first row 861) and a horizontal isolation structure (exemplified by the horizontal isolation structure 835). The components of the other rows are not labeled for the sake of simplicity, but similarly located structures are assumed to represent the same structures. In this embodiment, the first vertical stack 851 includes a channel 805, a first insulator 810 (represented by the solid line), a floating gate 815, a second insulator 820 (represented by the solid line) and a control gate 825.

As seen in FIG. 8, each of the rows 861, 862, 863, and 864 are configured so that the vertical stacks of each adjacent row are offset from one another. This can function to minimize the amount of area taken up by the overall memory array to thereby achieve smaller sizes.

Also disclosed herein are methods of making memory cells. An exemplary method includes a first step of forming, depositing or obtaining a stack. The stack generally includes alternating layers of insulating material and floating gate material. The stack can also be described as a bilayer stack of alternating insulating material (for example silica ($SiO_2$), or alumina ($Al_2O_3$)) and floating gate material (for example polysilicon). An exemplary beginning stack 901 is depicted in FIG. 9A and can include alternating layers of insulating material 903 and floating gate material 905. The number of floating gate material 905 layers in the beginning stack 901 can be chosen based on the desired number of memory cells in a single vertical stack; as each floating gate material layer 905 ultimately defines a single memory cell in a vertical stack. Deposition of the beginning stack 901 can be accomplished using methods such as physical vapor deposition (PVD), chemical vapor deposition (CVD), or atomic layer deposition (ALD). In some embodiments, the beginning stack can be formed using a low pressure (LP) CVD method.

The next step in an exemplary method includes forming a first void in the stack. FIG. 9B shows the stack 909 after the first void 907 has been formed in the stack. Generally, the first void 907 can have dimensions from 10 nm to 100 nm; or in some embodiments from 10 nm to 50 nm. The step of forming a first void can generally be accomplished by etching, for example by using methods such as dry etch or wet etch processes. In some embodiments, the first void can be formed using a dry etch method with low selectivity for oxide and poly silicon.

Once a first void has been formed in the stack, the next step is to deposit a first insulating material on at least the walls of the first void forming a second void. FIG. 9C shows the stack 911 after the second void 913 has been formed via deposition of the first insulating material 915. The first insulating material can be deposited on only the walls of the first void, or on the walls of the first void and other surfaces (such as the bottom of the first void and/or the top surface of the stack 909). In some embodiments where the first insulating material is deposited on surfaces other than the walls of the first void, additional processing steps may be undertaken to remove the first insulating material on other surfaces. The first insulating material 915 can generally include tunneling oxide materials. Exemplary tunneling oxide materials include magnesium oxide (amorphous, crystalline, or combinations thereof) and alumina ($Al_2O_3$) for example. The first insulating material can be deposited using methods such as physical vapor deposition (PVD), chemical vapor deposition (CVD), or atomic layer deposition (ALD) using a chemical source containing silicon and oxygen for example. An exemplary method for depositing the first insulating material can utilize high temperature CVD with tetra-ethyl-ortho-silicate (TEOS) as a silicon and oxygen source for example.

Once a second void has been formed, the next step includes deposition of channel material in the second void. FIG. 9D shows the stack 917 after deposition of the channel material 919. Generally, the channel material can include polysilicon (which can also be referred to as polycrystalline silicon or poly-Si), silicon germanium (SiGe, or $Si_{1-x}Ge_x$), gallium nitride (GaN), indium gallium nitride ($In_xGa_{1-x}N$), or aluminum gallium nitride ($Al_xGa_{1-x}N$) for example. The channel material can be deposited using methods such as physical vapor deposition (PVD), chemical vapor deposition (CVD), or atomic layer deposition (ALD). In some embodiments, the channel material can be deposited using atomic layer deposition (ALD) by co-depositing the desired components. In some embodiments, a removal process, such as chemical mechanical polishing (CMP) can be used after deposition of the channel material 919 in order to remove excess channel material that may have been deposited in unwanted areas.

Figure 9E:
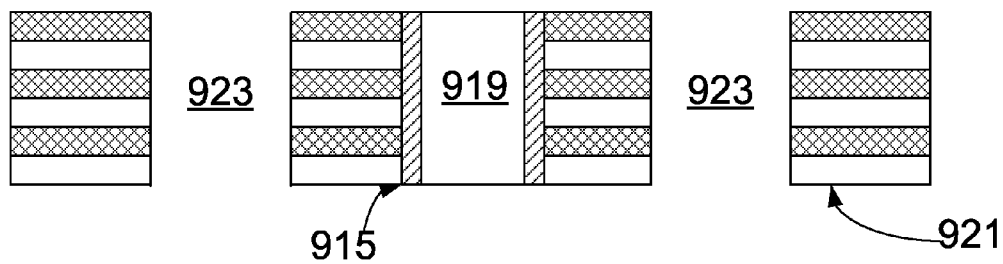

The next step in an exemplary method is forming a third void in the stack. FIG. 9E shows the stack 921 after the third void 923 has been formed in the stack. Generally, the third void 923 can have dimensions from 10 nm to 100 nm; or in some embodiments from 10 nm to 50 nm. The step of forming a third void can generally be accomplished by etching, for example by using dry etch or wet etch processes. In some embodiments, the third void can be formed using a dry etch process with low selectivity for oxide and polysilicon.

Figure 9F:
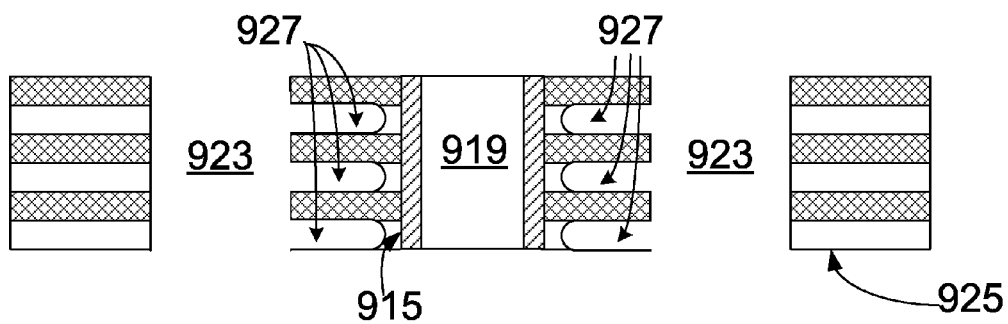

After the third void has been formed, the next step is to selectively remove portions of the floating gate material layers adjacent the third void. This step can be described as forming fourth voids. The number of fourth voids can generally be described as being equivalent to the number of floating gate material layers in the starting stack 901. FIG. 9F shows the stack 925 after formation of the fourth voids 927. The fourth voids 927 can be characterized as being orthogonal to each other, or in some embodiments parallel. Generally, the fourth voids 927 can have dimensions from 5 nm to 100 nm into the floating gate material layers. The step of forming fourth voids can generally be accomplished by etching, for example by using chemical etching methods such as chloride (—Cl) based chemistries, for example boron trichloride ($BCl_3$), hydrogen based etching ($H_2$), fluorine based etching, for example sulfur hexafluoride ($SF_6$), or oxygen based etching ($O_2$). Alternatively, dry etching methods can be utilized.

Figure 9G:
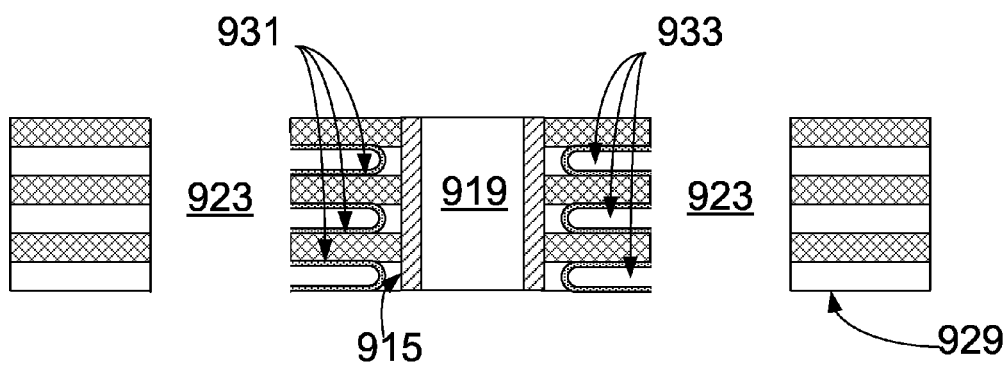

After the fourth voids are formed, the next step is to deposit the second insulating material on at least some of the surfaces of the fourth voids. In some embodiments, the second insulating material can be deposited on substantially all surfaces of the fourth voids forming second insulating material layers 931. FIG. 9G shows the stack 929 after formation of the second insulating material layers 931 within the fourth voids 927. This step can also be characterized as forming fifth voids. The fifth voids are designated collectively in FIG. 9G as 933. The fifth voids 933 can be characterized as being orthogonal to each other, or in some embodiments parallel. The second insulating material layers 931 can have dimensions from 5 nm to 100 nm. The second insulating material a multilayer structure of an oxide/nitride/oxide (referred to herein as "ONO"), or a high-k dielectric material. Exemplary high-k dielectric materials can include $HfO_2$, $Z_rO_2$, $Ta_2O_5$, $Y_2O_3$, $Nb_2O_5$, $Al_2O_3$, $TiO_2$, $CeO_2$, $In_2O_3$, $RuO_2$, MgO, SrO, $B_2O_3$, $SnO_2$, PbO, $PbO_2$, Pb3O4, $V_2O_3$, $La_2O_3$, $Pr_2O_3$, $Sb_2O_3$, $Sb_3O_5$, and CaO. In some embodiments, the second insulating material can be a multilayer structure of an oxide/nitride/oxide.

The step of depositing the second insulating material in some embodiments where the second insulating material is a multilayer structure can generally be accomplished, for example by using methods such as physical vapor deposition (PVD), chemical vapor deposition (CVD), or atomic layer deposition (ALD). In some embodiments, where the second insulating material is a multilayer structure, it can be deposited using dielectric deposition. The step of depositing the second insulating material in embodiments where the second insulating material is a high-k dielectric material can generally be accomplished, for example by using methods such as physical vapor deposition (PVD), chemical vapor deposition (CVD), or atomic layer deposition (ALD). In some embodiments, where the second insulating material is a high-k dielectric material, it can be deposited using ALD for example. In some embodiments, a removal process, such as chemical mechanical polishing (CMP) can be used after deposition of the second insulating material in order to remove excess material that may have been deposited in unwanted areas.

Figure 9H:
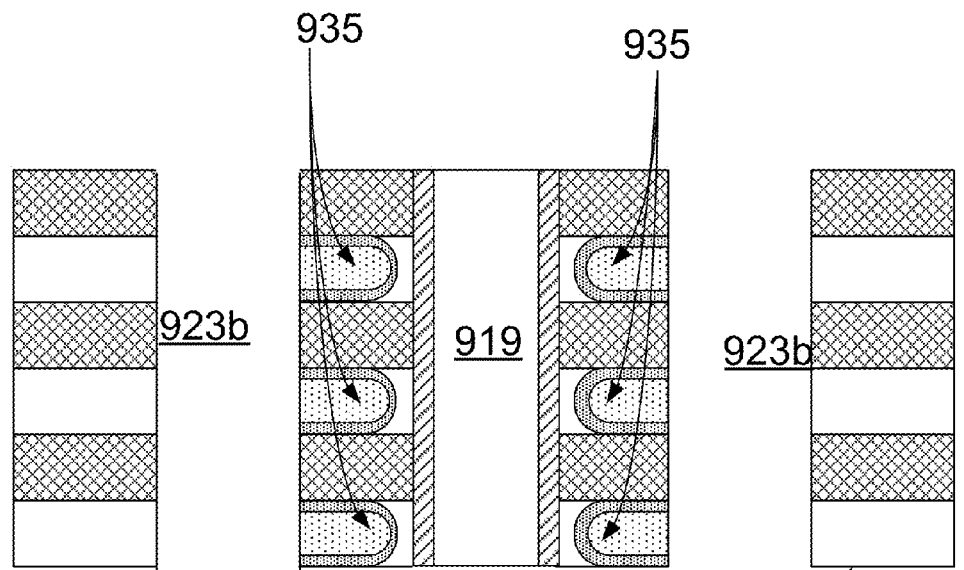

The next step is to deposit control gate material on at least some of the surfaces of the second insulating material layer. In some embodiments, the control gate material can be deposited on substantially all surfaces of the second insulating material layers forming control gate layers 935. FIG. 9H shows the stack 937 after formation of the control gate layers 935 within the fifth voids. The control gate layers 935 can have thicknesses from 10 nm to 100 nm. The control gate material can be polysilicon, or a metal for example. The step of depositing the control gate material can generally be accomplished, for example by using methods such as physical vapor deposition (PVD), chemical vapor deposition (CVD), or atomic layer deposition (ALD). In some embodiments, the control gate material can be deposited using ALD for example.

Figure 9J:
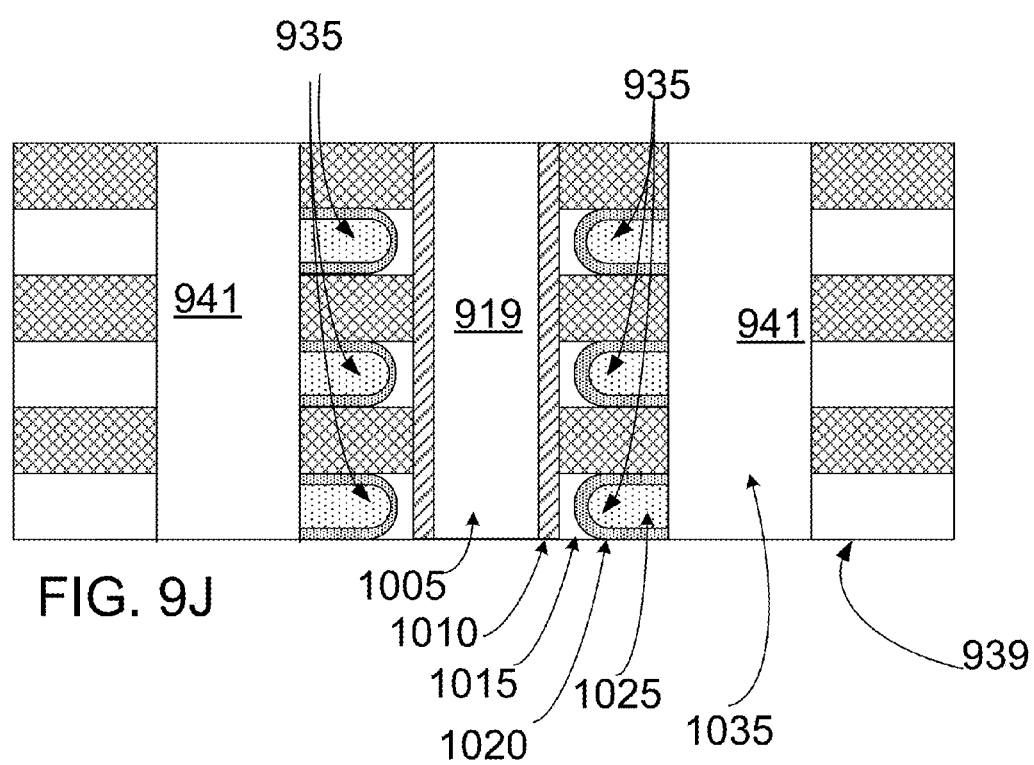

Generally, once the control gate material layers 935 are formed, the third void (described first in FIG. 9E is once again present. In some embodiments the void remaining after deposition of the control gate material can have substantially about (i.e., within about 10% or less) the same dimensions as the third void 923 that was formed in the step depicted in connection with FIG. 9E. This void, the sixth void is depicted as sixth void 923b. The next step is to deposit isolating material within the sixth void 923b. In some embodiments, vertical etching can take place between deposition of the control gate material and deposition of the isolating material in order to remove excess control gate material in the sixth void 923b. FIG. 9J depicts the article 939 after deposition of the isolating material structure 941. Generally, this step can be described as forming horizontal isolation structures (as they were described with respect to articles previously). The isolating material can generally be any electrically insulating or electrically isolating material. Exemplary materials can include for example silica ($SiO_2$), and alumina ($Al_2O_3$). The step of depositing the isolating material can generally be accomplished, for example by using methods such as physical vapor deposition (PVD), chemical vapor deposition (CVD), or atomic layer deposition (ALD). In some embodiments, the isolating material can be deposited using CVD for example.

Other optional methods, not depicted herein can include additional steps that can be designed, for example to form additional vertical stacks and or additional rows within a memory array.

Memory cells and memory arrays as disclosed herein utilize the floating gates as the charge storage node. Such a memory storage device can offer an improved coupling ratio in comparison to two dimensional NAND architecture that is currently utilized. This is thought to be due to the enlarged surface area between the floating gate and the control gate. The improved coupling ration may provide a low bias operation for both program and erase functions. Scalability of the memory cell (and memory arrays) can be achieved by scaling the channel size rather than the floating gate size. Memory arrays as disclosed herein can also minimize the floating gate—floating gate interference in a row by controlling the thickness of the isolator between the floating gates.

Memory cells and memory arrays disclosed herein can be utilized in single-level cell (SLC), multi-level cell (MLC) tri-level cell (TLC), or quad-level cell (QLC) modes to house 1, 2, 3, or 4 bits/cell respectively.

Thus, embodiments of THREE DIMENSIONAL FLOATING GATE NAND MEMORY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:

1. A method of making a memory array, the method comprising:
    depositing a bilayer stack of alternating insulating material and floating gate material;
    etching a first void in the stack;
    depositing a first insulating material on at least the walls of the first void forming a second void;
    depositing channel material in the second void;
    etching a third void in the stack, the third void being substantially circular and surrounding the channel material;
    selectively etching portions of the floating gate material adjacent the third void forming fourth voids, wherein the fourth voids are generally parallel to each other;
    depositing a second insulating material on the surfaces of the fourth voids;
    depositing control gate material on the second insulating material, forming a sixth void;
    and depositing isolating material in the sixth void.

2. The method according to claim 1, wherein the step of depositing the bilayer stack comprises using physical vapor deposition (PVD), chemical vapor deposition (CVD), atomic layer deposition (ALD), or combinations thereof.

3. The method according to claim 1, wherein the step of depositing the bilayer stack comprises using low pressure (LP) CVD.

4. The method according to claim 1, wherein the first void has dimensions from about 10 nm to about 100 nm.

5. The method according to claim 1, wherein the step of depositing the first insulating material comprises using physical vapor deposition (PVD), chemical vapor deposition (CVD), atomic layer deposition (ALD), or combinations thereof.

6. The method according to claim 1, wherein the step of depositing the first insulating material comprises using high temperature CVD with tetra-ethyl-ortho-silicate (TEOS) as a silicon and oxygen source.

7. The method according to claim 1, wherein the step of depositing the channel material comprises using physical vapor deposition (PVD), chemical vapor deposition (CVD), atomic layer deposition (ALD), or combinations thereof.

8. The method according to claim 1, wherein the step of depositing the channel material comprises using atomic layer deposition (ALD) by co-depositing the desired component.

9. The method according to claim 1 further comprising removing excess channel material before the step of etching the third void.

10. The method according to claim 1, wherein the step of selectively etching portions of the floating gate material comprises using chemical etching using chloride based chemistries, hydrogen based etching, fluorine based etching, oxygen based etching, or combinations thereof.

11. The method according to claim 1, wherein the step of selectively etching portions of the floating gate material comprises using $BCl_3$, $H_2$, $SF_6$, or $O_2$.

12. The method according to claim 1, wherein the step of depositing the second insulating material is accomplished using dielectric deposition.

13. The method according to claim 1, wherein the step of depositing the second insulating material comprises using physical vapor deposition (PVD), chemical vapor deposition (CVD), atomic layer deposition (ALD), or mixtures thereof.

14. The method according to claim 1 further comprising vertical etching between deposition of the control gate material and deposition of the isolating material in order to remove excess control gate material.

15. A method of making a memory array, the method comprising:
    depositing a bilayer stack of alternating insulating material and floating gate material, wherein the insulating material comprises silica, alumina, silicon nitride, or combinations thereof and the floating gate material comprises polysilicon;

etching a first void in the stack;

depositing a first insulating material on at least the walls of the first void forming a second void;

depositing channel material in the second void, wherein the channel material comprises polysilicon, silicon germanium, gallium nitride, indium gallium nitride, aluminum gallium nitride, or combinations thereof;

etching a third void in the stack, the third void being substantially circular and surrounding the channel material;

selectively etching portions of the floating gate material adjacent the third void forming fourth voids, wherein the fourth voids are generally parallel to each other;

depositing a second insulating material on the surfaces of the fourth voids;

depositing control gate material on the second insulating material, forming a sixth void, wherein the control gate material comprises polysilicon or metal; and depositing isolating material in the sixth void.

16. The method according to claim 15 further comprising removing excess channel material before the step of etching the third void.

17. The method according to claim 15 further comprising vertical etching between deposition of the control gate material and deposition of the isolating material in order to remove excess control gate material.

18. The method according to claim 15, wherein depositing the bilayer stack, depositing the first insulating material, depositing the channel material, depositing the second insulating material, depositing the control gate material, and depositing the isolating material independently comprises using physical vapor deposition (PVD), chemical vapor deposition (CVD), atomic layer deposition (ALD), or mixtures thereof.

19. The method according to claim 15, wherein the step of selectively etching portions of the floating gate material comprises using chemical etching using chloride based chemistries, hydrogen based etching, fluorine based etching, oxygen based etching, or combinations thereof.

20. A method of making a memory array, the method comprising:

depositing a bilayer stack of alternating insulating material and floating gate material;

etching a first void in the stack;

depositing a first insulating material on at least the walls of the first void forming a second void;

depositing channel material in the second void;

removing excess channel material;

etching a third void in the stack, the third void being substantially circular and surrounding the channel material;

selectively etching portions of the floating gate material adjacent the third void forming fourth voids, wherein the fourth voids are generally parallel to each other;

depositing a second insulating material on the surfaces of the fourth voids;

depositing control gate material on the second insulating material, forming a sixth void;

vertical etching a portion of the deposited control gate material; and depositing isolating material in the sixth void.

* * * * *